United States Patent
Tan et al.

(10) Patent No.: US 8,692,380 B2
(45) Date of Patent: Apr. 8, 2014

(54) INTEGRATED CIRCUIT SYSTEM WITH SUB-GEOMETRY REMOVAL AND METHOD OF MANUFACTURE THEREOF

(71) Applicant: GlobalFoundries Singapore Pte. Ltd., Singapore (SG)

(72) Inventors: Soon Yoeng Tan, Singapore (SG); Huey Ming Chong, Singapore (SG); Byoung-Il Choi, Singapore (SG); Soo Muay Goh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/657,797

(22) Filed: Oct. 22, 2012

(65) Prior Publication Data

US 2013/0043565 A1   Feb. 21, 2013

Related U.S. Application Data

(62) Division of application No. 12/477,448, filed on Jun. 3, 2009, now Pat. No. 8,293,546.

(60) Provisional application No. 61/073,362, filed on Jun. 17, 2008.

(51) Int. Cl.
*H01L 23/58* (2006.01)
*H01L 29/41* (2006.01)

(52) U.S. Cl.
USPC ............... 257/773; 257/786; 257/E23.151; 257/E29.112

(58) Field of Classification Search
USPC ............... 430/5; 438/16; 716/50, 51, 54, 55; 257/773, 786, E23.151, E29.112
See application file for complete search history.

(56) References Cited

U.S. PATENT DOCUMENTS

| | | | |
|---|---|---|---|
| 5,781,656 A * | 7/1998 | Hagino et al. | 382/144 |
| 6,047,116 A | 4/2000 | Murakami et al. | |
| 6,081,272 A | 6/2000 | Morimoto et al. | |
| 6,282,696 B1 | 8/2001 | Garza et al. | |
| 6,507,944 B1 * | 1/2003 | Kikuchi et al. | 716/55 |
| 6,596,656 B2 | 7/2003 | Tanaka et al. | |
| 6,709,880 B2 | 3/2004 | Yamamoto et al. | |
| 6,787,789 B2 | 9/2004 | Van Der Laan | |
| 6,795,952 B1 | 9/2004 | Stine et al. | |
| 6,892,375 B2 | 5/2005 | Kimura | |
| 6,901,575 B2 | 5/2005 | Wu et al. | |
| 7,001,712 B2 | 2/2006 | Imai et al. | |
| 7,216,331 B2 | 5/2007 | Wu et al. | |
| 7,242,477 B2 | 7/2007 | Mieher et al. | |
| 7,266,800 B2 | 9/2007 | Sezginer | |
| 7,280,212 B2 | 10/2007 | Mieher et al. | |
| 7,280,945 B1 | 10/2007 | Weiner et al. | |
| 7,289,213 B2 | 10/2007 | Mieher et al. | |
| 7,469,057 B2 * | 12/2008 | Hung et al. | 382/144 |
| 7,480,889 B2 | 1/2009 | Abrams et al. | |
| 7,504,182 B2 | 3/2009 | Stewart et al. | |
| 7,568,174 B2 | 7/2009 | Sezginer et al. | |
| 7,818,709 B2 * | 10/2010 | Sagisaka et al. | 716/54 |

(Continued)

*Primary Examiner* — Mary Wilczewski
(74) *Attorney, Agent, or Firm* — Ishimaru & Associates LLP

(57) ABSTRACT

A method of manufacture of an integrated circuit system includes: forming reticle data; detecting a sub-geometry, a singularity, or a combination thereof in the reticle data; applying a unit cell, a patch cell, or a combination thereof for removing the sub-geometry, the singularity, or the combination thereof from the reticle data; and fabricating an integrated circuit from the reticle data.

8 Claims, 7 Drawing Sheets

(56) References Cited

U.S. PATENT DOCUMENTS

| | | |
|---|---|---|
| 8,293,546 B2 * | 10/2012 | Tan et al. .................... 438/16 |
| 2003/0046655 A1 | 3/2003 | Kimura |
| 2003/0054580 A1 | 3/2003 | Yamamoto et al. |
| 2004/0165761 A1 * | 8/2004 | Hung et al. .................. 382/141 |
| 2005/0164099 A1 | 7/2005 | Gelsomini |
| 2007/0094634 A1 | 4/2007 | Seizginer et al. |
| 2007/0184357 A1 | 8/2007 | Abrams et al. |
| 2007/0184369 A1 | 8/2007 | Abrams et al. |
| 2007/0220477 A1 * | 9/2007 | Sagisaka et al. ............. 716/21 |
| 2009/0309192 A1 * | 12/2009 | Tan et al. .................... 257/618 |
| 2010/0183959 A1 * | 7/2010 | Higaki et al. ................ 430/5 |

* cited by examiner

INTEGRATED CIRCUIT SYSTEM WITH SUB-GEOMETRY REMOVAL AND METHOD OF MANUFACTURE THEREOF

CROSS-REFERENCE TO RELATED APPLICATION(S)

This application is a divisional of U.S. patent application Ser. No. 12/477,448 filed Jun. 3, 2009, now U.S. Pat. No. 8,293,546, which claims the benefit of U.S. Provisional Patent Application Ser. No. 61/073,362 filed Jun. 17, 2008.

TECHNICAL FIELD

The present invention relates generally to an integrated circuit system, and more particularly to an integrated circuit system for removing sub-geometries and singularities from photomask data and the integrated circuits produced therefrom.

BACKGROUND ART

Integrated circuits find application in many of today's consumer electronics, such as cell phones, video cameras, portable music players, printers, computers, etc. Integrated circuits may include a combination of active devices, passive devices and their interconnections.

Integrated circuit fabrication typically requires a multitude of photomasks, wherein each photomask defines a specific design level that serves a particular purpose. The photomask may contain a series of shapes indicating the regions that are to be processed by the particular manufacturing step that uses the photomask. The combination of all of the shapes in the photomask set, when processed in order, forms the circuitry of the integrated circuit product.

Generally, an integrated circuit layout consists of two categories of data: design layers (designed by a layout designer) and non-design layers (layers generated with Boolean algorithms and typically done by a foundry). These design and non-design layers can be formed by Boolean algorithms ranging from the simple to the complicated, which can require special sizing.

Unfortunately, complicated Boolean algorithms can produce singularities and sub-geometry features, such as slit and slot features, within the mask level data. The singularities and sub-geometries represent unintentional features that have a size that is below the minimum feature size of the integrated circuit technology. An example of this may be an inadvertent joining of two rectangles, in a 90 nm technology, that has a cross-section of less than 2 nm. The resolution of the 90 nm technology might not be able to reliably support the cross-section size which can lead to manufacturing problems, lower wafer yields, and increased costs.

Some of these sub-geometries can be removed at the layout data level by the application of a size up/size down cleaning rule, wherein some of the polygons are sized up to remove the sub-geometry feature formed between them, and then re-sized down to obtain a resultant dimension that does not impact device performance. If the sub-geometries are not addressed unexpected or parasitic devices could be formed that can damage an operating electronic device.

However, a simple sizing rule does not work for all structures and some sub-geometries and singularities may remain. As a result, a mask writing tool may not be able to resolve the pattern and/or the sub-geometries left behind and the mask inspection tool will find the mask difficult to inspect. Additionally, a lithographer might see sub-geometries printed on the wafer, which can increase the likelihood or chance of resist lifting that can adversely affect wafer yield and device performance.

Thus, a need still remains for an integrated circuit system with sub-geometry removal. In view of the continuing trend to increase the electronic content in personal devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: forming reticle data; detecting a sub-geometry, a singularity, or a combination thereof in the reticle data; applying a unit cell, a patch cell, or a combination thereof for removing the sub-geometry, the singularity, or the combination thereof from the reticle data; and fabricating an integrated circuit from the reticle data.

The present invention provides an integrated circuit system comprising: reticle data on a photomask; a sub-geometry, a singularity, or a combination thereof detected in the reticle data; a unit cell, a patch cell, or a combination thereof for removing the sub-geometry, the singularity, or the combination thereof from the reticle data; and an integrated circuit fabricated from the reticle data.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
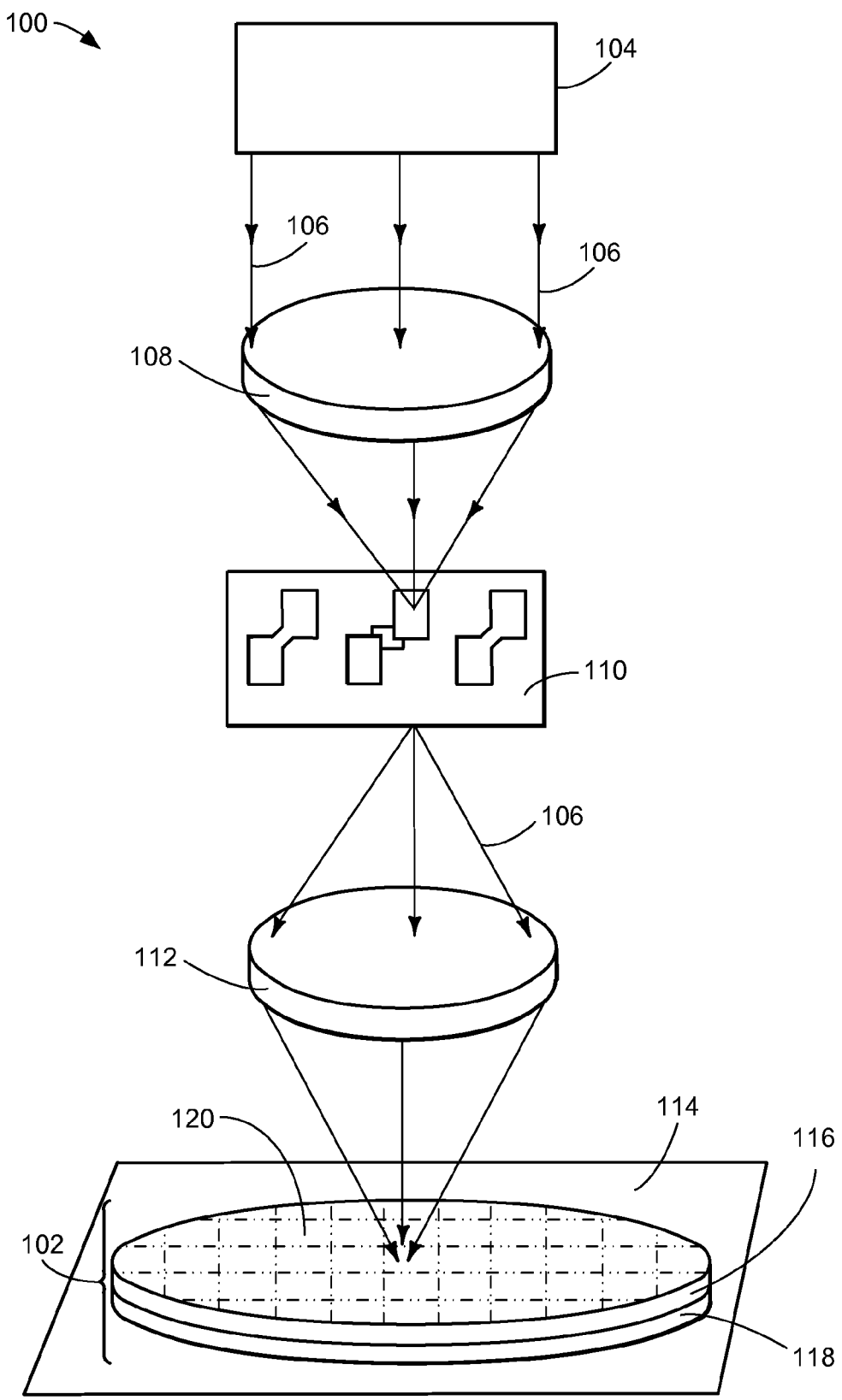
FIG. 1 is an isometric view of the basic elements of a photolithography system used to pattern an integrated circuit system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown an isometric view of the basic elements of a photolithography system 100 used to pattern an integrated circuit system 102 in accordance with an embodiment of the present invention. The isometric view of the basic elements of the photolithography system 100 depicts a radiation source 104, such as an Argon Fluoride (ArF) excimer laser light source, providing radiation beams 106 having a wavelength of 193 nm or less.

A condenser 108, such as a focusing lens system, may receive the radiation beams 106 and converge the radiation beams 106 on a reticle system 110. The reticle system 110 may be a group of photomasks, such as fused silica blanks of amorphous quartz, having a thin patterned opaque metal layer such as chromium deposited on one surface of the blank. The pattern formed in the opaque metal layer may be the complex geometric shapes associated with patterning a single manufacturing process step for an integrated circuit (not shown).

A set of projection optics 112, may collect the radiation beams 106 that are passed through the reticle system 110 which now depicts the pattern provided by the reticle system 110. This pattern may represent a single pattern associated with the manufacturing step being performed on the integrated circuit system 102. Many such iterative steps go into the manufacturing of the integrated circuit system 102.

A stepper 114, such as an x-y orientation stepping platform, may be used to relocate the integrated circuit system 102 for exposure of single image of a component layer of the integrated circuit (not shown). A photoresist material 116, such as a super fine pattern forming material, is applied on a substrate 118. The substrate 118 may be a semiconductor wafer having an integrated circuit 120 fabricated thereon.

The integrated circuit 120 may reflect the contents of the reticule system 110 and be free of layer singularities and sub-geometries. The integrated circuit 120 may be singulated from the substrate 118 by being diced.

Figure 2:
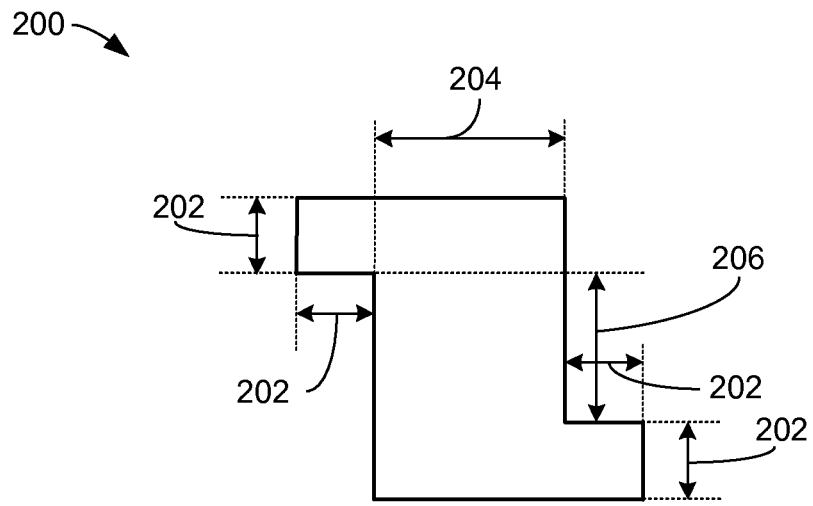
FIG. 2 is a plan view of a unit cell in accordance with an embodiment of the present invention.

Referring now to FIG. 2, therein is shown a plan view of a unit cell 200 in accordance with an embodiment of the present invention. The plan view of the unit cell 200 depicts a generalized form of the unit cell 200, such as a complex geometric shape.

In some embodiments, the size and/or dimensions of the unit cell 200 can be illustrated by one or more measurements or sections. By way of example, in one embodiment, a tab measurement 202 can be of a fixed dimension, such as 50 nanometers, while a horizontal measurement 204 and a vertical measurement 206 can depend on the distance between adjacent geometries (not shown) that form a sub-geometry (not shown).

In other embodiments, the tab measurement 202 may need to satisfy a minimum dimension rule to ensure that the unit cell 200 can be resolved when patterning the substrate 118, of FIG. 1, with the reticle system 110, of FIG. 1. However, it is to be understood that the size and/or dimensions of the tab measurement 202, the horizontal measurement 204, and the vertical measurement 206 can be modified to meet the design requirements of the technology node of the integrated circuit system 102, of FIG. 1. The technology node may be designated by the minimum dimension of a feature, including technology nodes such as 135 nm, 90 nm, 65 nm, or 50 nm.

In some embodiments, the unit cell 200 can be described as "Z" shaped because of two projections that extend from opposite ends and corners of a central geometry. It is understood that the unit cell 200 may be inverted or rotated in order to remove the sub-geometry between the adjacent shapes.

Figure 3:
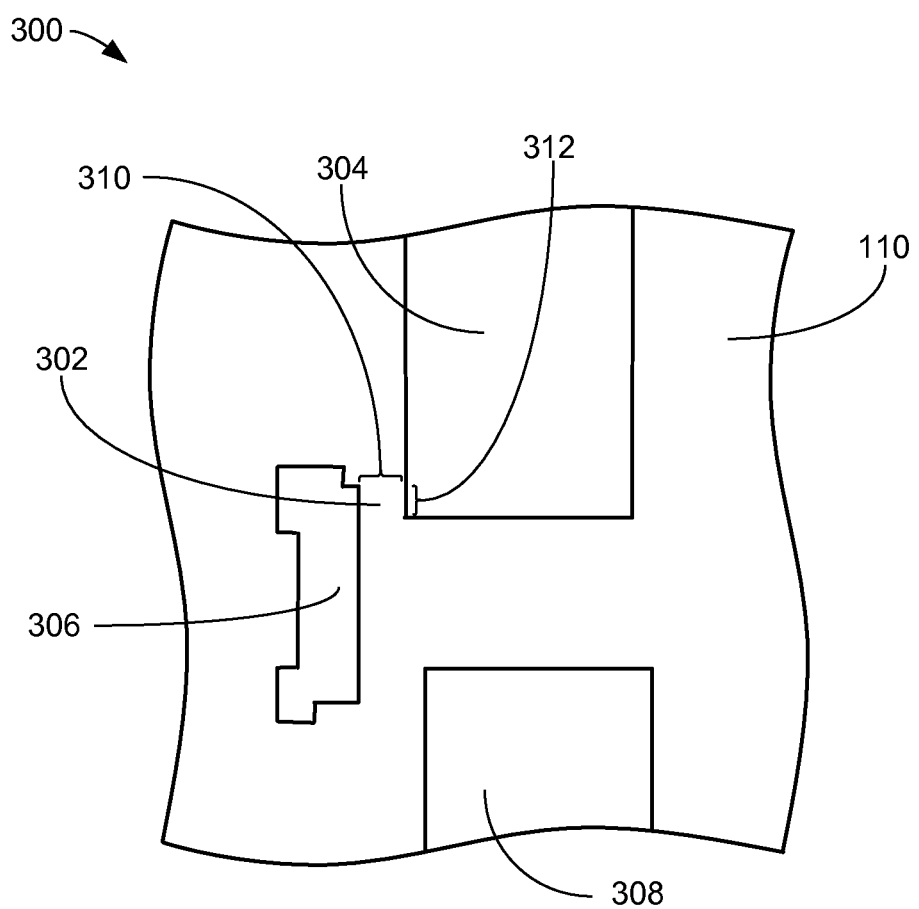
FIG. 3 is a pictorial representation section of a reticle data having a sub-geometry.

Referring now to FIG. 3, therein is shown a pictorial representation section of a reticle data 300 having a sub-geometry 302. The pictorial representation section of the reticle data 300 depicts the sub-geometry 302 formed between a first shape 304 and a second shape 306 as generated in the reticle system 110.

The sub-geometry 302 would cause a mask rules check (MRC) violation because it violates a minimum size requirement for the example technology node. The relationship of the second shape 306 to a third shape 308 has sufficient spacing to not create an additional MRC violation.

The sub-geometry 302 has a width 310 and a height 312. One or both of these dimensions may create a shape in the reticle data 300 that could cause a manufacturing problem. In order to correct the MRC violation additional geometries may be added to the reticle data 300.

This example is intended to demonstrate how the MRC violation may occur in the generation of the reticle data 300. It is understood that other configurations could cause MRC violations and the present example is intended to show how any of the currently irresolvable violations may be resolved by the current invention.

Figure 4:
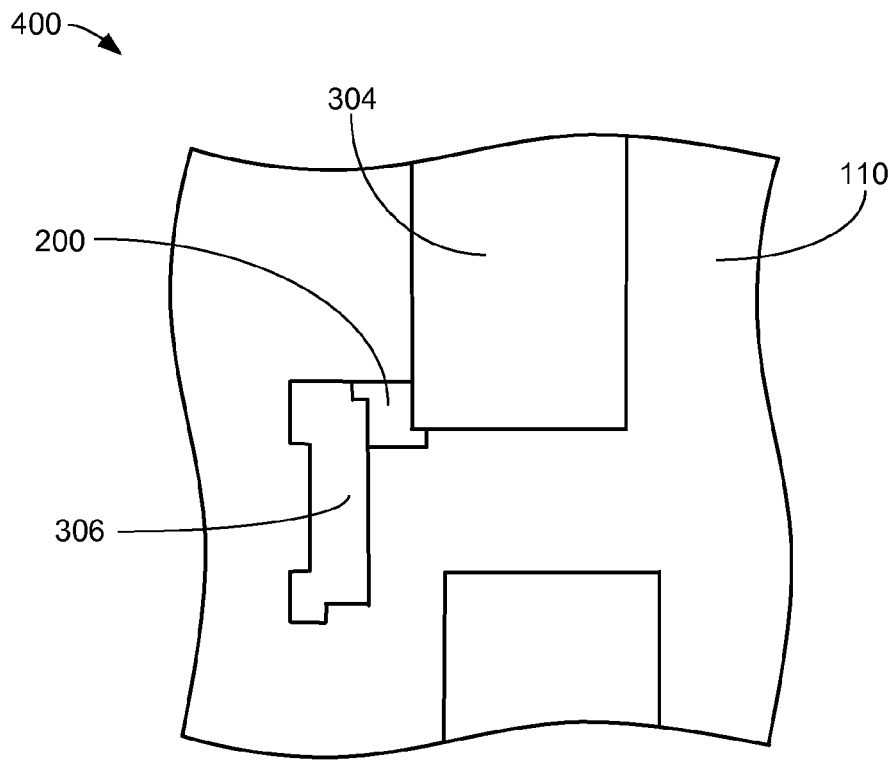
FIG. 4 is a view of a reticle data employing the unit cell to remove the sub-geometry in accordance with an embodiment of the present invention.

Referring now to FIG. 4, therein is shown a view of a reticle data 400 employing the unit cell 200 to remove the sub-geometry 302 in accordance with an embodiment of the present invention. In some embodiments, the vertices of the first shape 304 and the second shape 306 can be used to indicate where the sub-geometry feature is located within a coordinate system, such as a Cartesian coordinate system, of a layout.

In other embodiments, the unit cell 200 can be generated from the data of the first shape 304 and the second shape 306. Data of the first shape 304 and the second shape 306 may include, but is not limited to, one or more variables, such as the width 310, of FIG. 3, and the height 312, of FIG. 3, which can be determined by calculating the dimensions of the first shape 304 and the second shape 306 and their relative position.

The reticle system 110 may employ one or more of the unit cell 200 between one or more of the first shape 304 and the second shape 306. In the above example the spacing of the third shape 308 is in compliance with the MRC, but if an MRC violation had been detected between the second shape 306 and the third shape 308, the unit cell 200 would be applied to resolve the MRC violation.

It is understood that while the general characteristics of the unit cell 200 remains constant, the actual size may differ for each of the unit cells 200 applied. The size of the unit cell 200 may vary in the width 310, of FIG. 3, and the height 312, of FIG. 3, as described above.

The unit cell 200 can help to remove the sub-geometries 302 that may be unresolved within the reticle data 400. It is also to be understood that the reticle data 400 may include any structure formed on or over any layer of the integrated circuit system 102, of FIG. 1.

The reticle data 400 can represent the original data formed by the layout data level of electronic design automaton software or it may be generated by Boolean combinations of the layout data. The Boolean combinations of the layout data may be generated by the manufacturing software for photomask generation.

Figure 5:
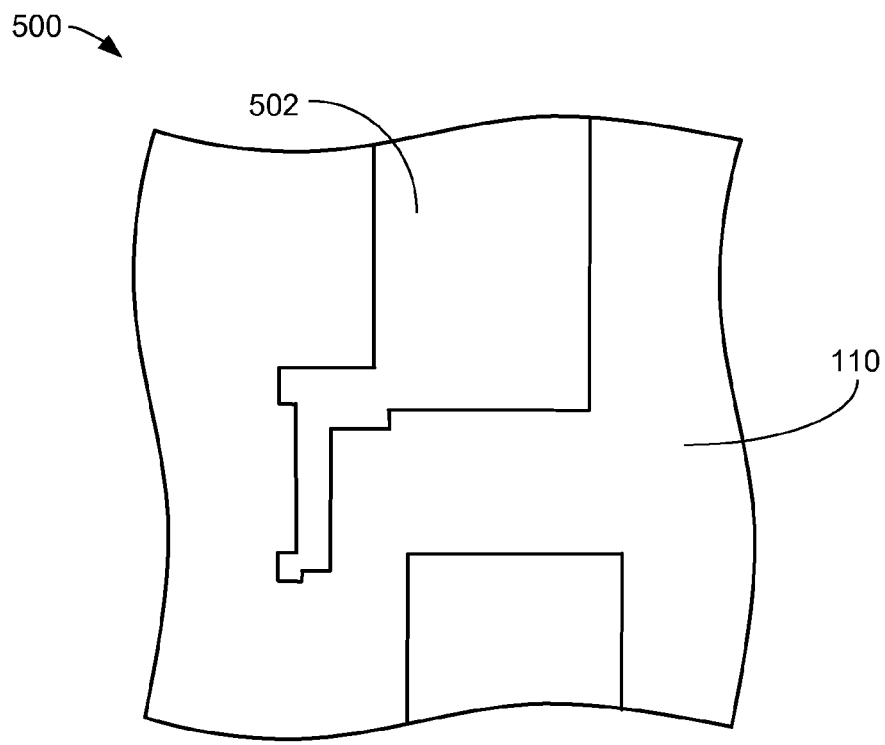
FIG. 5 is a view of a reticle data after merging a unit cell as new data in accordance with an embodiment of the present invention.

Referring now to FIG. 5, therein is shown a view of a reticle data 500 after merging a unit cell as new data in accordance with an embodiment of the present invention. The view of the reticle data 500 depicts the reticle system 110 after merging the unit cell 200, of FIG. 4, as a new shape 502 in accordance with an embodiment of the present invention.

The unit cell 200 when plotted as part of the new shape 502 and formed on the reticle system 110 removes the sub-geometry 302, of FIG. 3, at the layout data level, the reticle system 110 level, and/or the integrated circuit system 102, of FIG. 1.

It has been discovered that the incorporation of the unit cell 200 during the generation of the reticle data 500 may prevent MRC violations and improve the manufacturing yield of the integrated circuit system 102, of FIG. 1.

Figure 6:
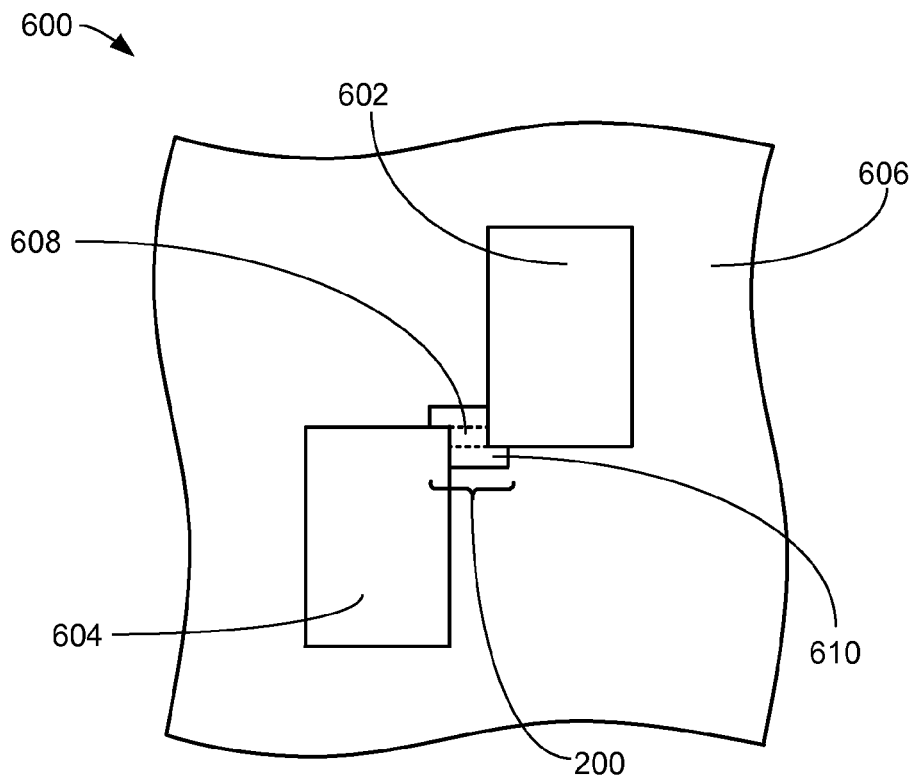
FIG. 6 is a view of a reticle data employing a unit cell in accordance with an embodiment of the present invention.

Referring now to FIG. 6, therein is shown a view of a reticle data 600 employing a unit cell in accordance with an embodiment of the present invention. The view of the reticle data 600 depicts a first rectangle shape 602 adjacent to a second rectangle shape 604.

The unit cell 200 is placed between the first rectangle shape 602 and the second rectangle shape 604.

Each of the first rectangle shape 602, the second rectangle shape 604, and the unit cell 200 can be formed over and/or within a medium 606, such as a quartz or glass substrate having clear and opaque regions representing the reticle data 600. It is to be understood that the medium 606 can represent a layout data level, the reticle system 110, of FIG. 1, and/or the integrated circuit system 102, of FIG. 1.

By way of example, and for ease of discussion, the unit cell 200 can be divided into two sections, a first region 608 and a second region 610, based upon their functionality. In some embodiments, the first region 608 can be used to fill the gap, distance, or space between one or more of the first rectangle shape 602 and the second rectangle shape 604, thereby helping to remove the sub-geometries 302, of FIG. 3.

The second region 610 can be employed to improve the resolution of the connection region, when the overlapping region of the first rectangle shape 602 and the second rectangle shape 604 is too short. It is understood that the system and method described herein can be used in a multitude of applications including removing the sub-geometry 302 that may exist adjacent the first rectangle shape 602 or between two or more of the first rectangle shape 602 and the second rectangle shape 604, regardless of the function of the affected layer.

Figure 7:
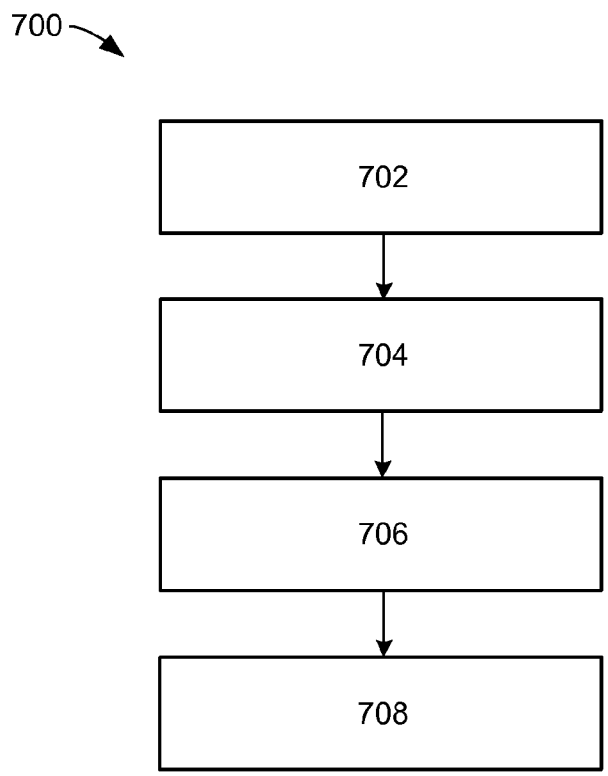
FIG. 7 is a flow chart of an exemplary process for removal of the sub-geometries by adding a unit cell to the reticle data, in accordance with an embodiment of the present invention.

Referring now to FIG. 7, therein is shown a flow chart of an exemplary process 700 for removal of the sub-geometries by adding a unit cell to the reticle data, in accordance with an embodiment of the present invention. The flow chart of the exemplary process 700 depicts a combine data 702.

The combine data 702 may produce manufacturing layer layout information, used to fabricate the integrated circuit system 102, of FIG. 1, by performing a Boolean operation on one or more layout design layers. Since the Boolean operation may produce the sub-geometry 302, of FIG. 3, a check dimensions 704 must verify all spacing.

The check dimensions 704 may perform a MRC on all of the shapes of the combine data 702 in order to identify the sub-geometry 302. The coordinates of all of the shapes in the combine data 702 may be identified and separation distances calculated in order to identify the sub-geometry 302.

If one or more of the sub-geometry 302 is identified by the check dimensions 704, an insert unit cell 706 will place and adjust the unit cell 200, of FIG. 2. The adjustment of the unit cell 200 may include matching the width 310, of FIG. 3, and the height 312, of FIG. 3, to the sub-geometry 302 identified by the check dimensions 704.

A merge data 708 may perform an additional Boolean operation, such as an "OR" operation to merge the unit cell 200 into the new shape 502, of FIG. 5, created by the merge data 708. The resulting geometry of the new shape 502 may have the sub-geometry 302 removed.

Figure 8:
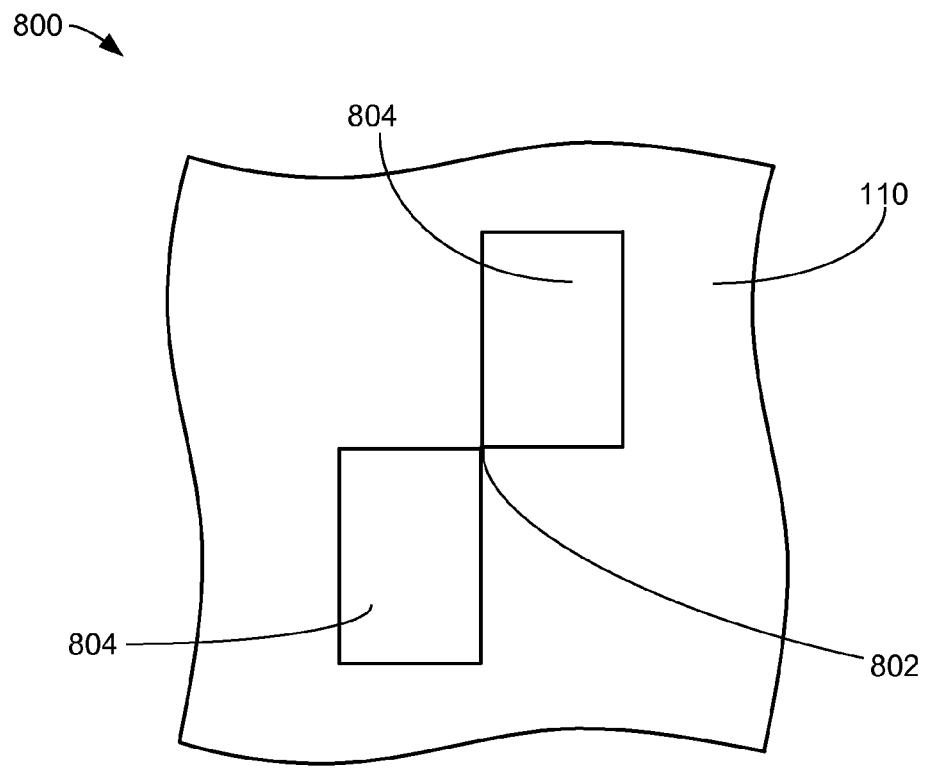
FIG. 8 is a view of a reticle data having a singularity formed between two or more of the rectangular shapes within a reticle system in accordance with an embodiment of the present invention.

Referring now to FIG. 8, therein is shown a view of a reticle data 800 having a singularity 802 formed between two or more rectangular shapes 804 within a reticle system 110 in accordance with an embodiment of the present invention. The view of the reticle data 800 depicts two of the rectangular shapes 804 meeting at a corner in a diagonal joining The singularity 802 may be detected when two shapes in the reticle data 800 meet in a single point as depicted in FIG. 8. The single point of contact may include a slight overlap of the rectangular shapes 804 wherein the cross-section of the slight overlap does not meet the minimum dimension of the MRC.

In an embodiment, a script, such as a series of instructions generated from a scripting language, can be used to determine the singularity 802 between two or more of the rectangular shapes 804. In some embodiments, the vertices of the rectangular shapes 804 can be used to indicate where the singularity 802 is located within a coordinate system, such as a Cartesian coordinate system, of a layout.

It is understood that the rectangular shapes 804 may include any structure formed on or over any layer of the integrated circuit system 102, of FIG. 1, and that the rectangular shapes 804 is an example only. The rectangular shapes 804 can represent the original data formed at the layout data level by electronic design automation software or combined in a Boolean operation by a manufacturing software used for fabricating the integrated circuit system 102, of FIG. 1.

Figure 9:
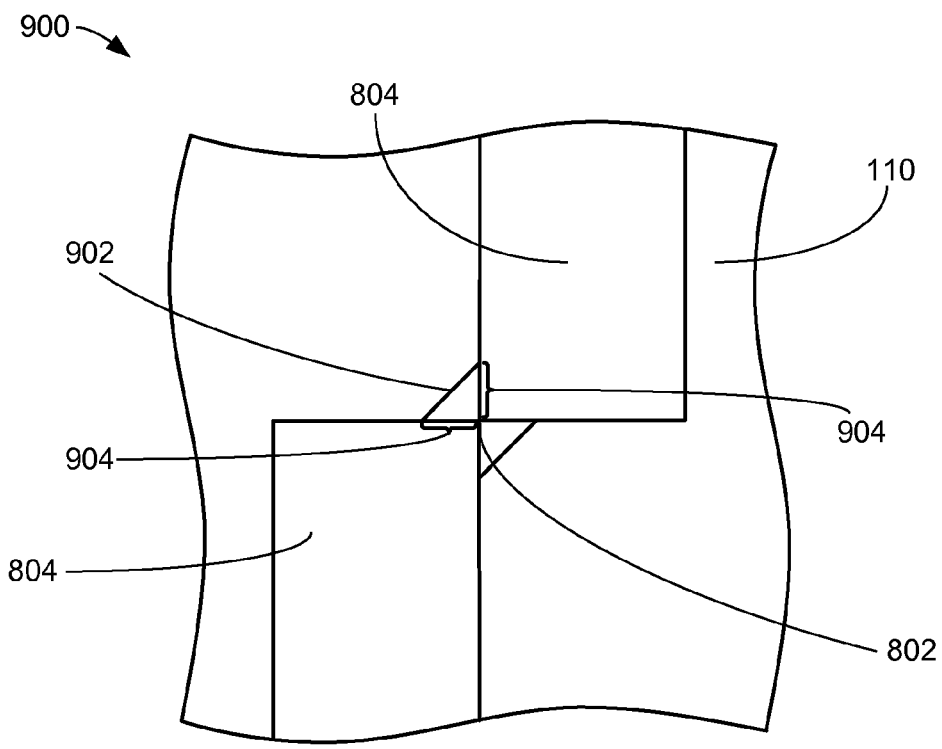
FIG. 9 is a view of a reticle data including a patching cell and/or method between two or more of the rectangular shapes within a reticle system in accordance with an embodiment of the present invention.

Referring now to FIG. 9, therein is shown a view of a reticle data 900 including a patch cell 902 and/or method between two or more of the rectangular shapes 804 within a reticle system 110 in accordance with an embodiment of the present invention. The view of the reticle data 900 depicts a pair of the rectangular shapes 804 positioned to form the singularity 802.

In an embodiment, after the script identifies the singularity 802, two equidistant and parallel offset lines, such as the lines 902, can be created between each of the rectangular shapes 804, thereby forming what can be termed a "bridge region" between the rectangular shapes 804. However, it is to be understood that in other embodiments, each of the line 902 need not be equidistant or parallel, each of the lines 902 need only connect or "bridge" a portion of each of the rectangular shapes 804 to an other of the rectangular shape 804.

By way of example, in one embodiment, a measurement 904, such as a fixed measurement, may be 50 nanometers. In other embodiments, the measurement 904 may need to satisfy a minimum dimension rule to ensure that the bridged region does not create an additional MRC violation.

Figure 10:
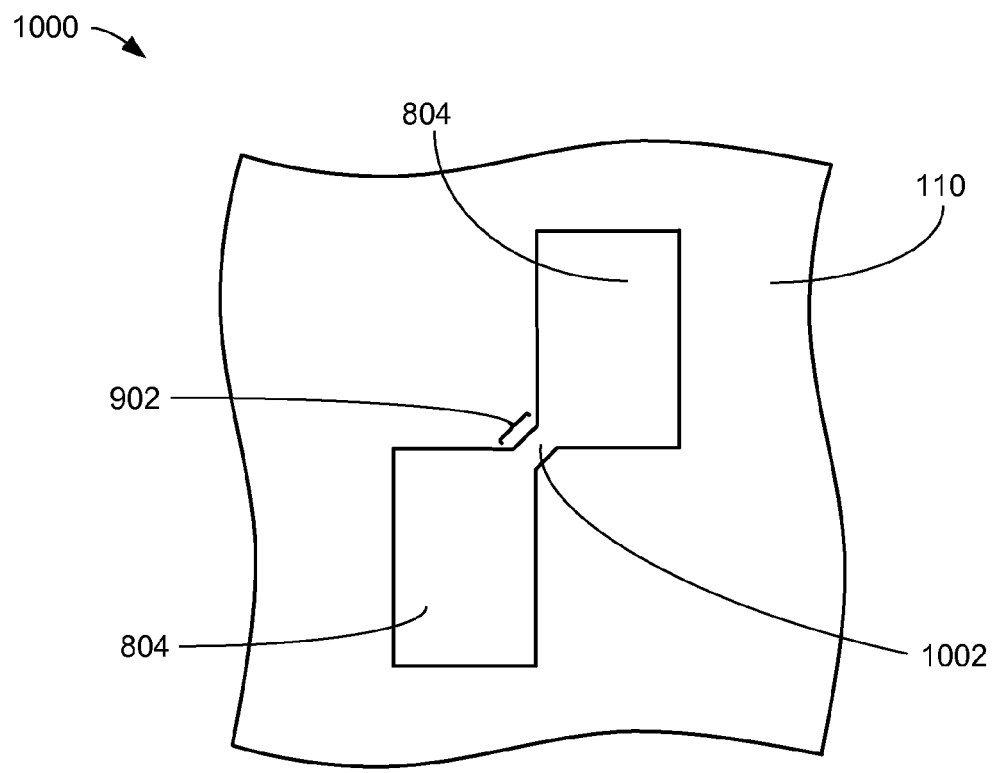
FIG. 10 is a view of a reticle data after merging the patch cell as new data in accordance with an embodiment of the present invention.

Referring now to FIG. 10, therein is shown a view of a reticle data 1000 after merging the patch cell 902 as new data in accordance with an embodiment of the present invention. The view of the reticle data 1000 depicts a new shape 1002 resulting from a Boolean operation, such as an "OR" of the rectangular shapes 804 and the patch cell 902, on the reticle system 110.

The new shape 1002 can be resolved when patterning the substrate 118, of FIG. 1, with the reticle system 110, of FIG. 1. However, it is to be understood that the size and/or dimension of the measurement 904, of FIG. 9, can be modified to meet the design requirements, such as the technology node, the design rule, and/or the dimensions of a singularity, of the integrated circuit system 102, of FIG. 1.

In some embodiments, points on each of the line 902 can be used to indicate where the patch cell 902 should subsequently be located within a coordinate system, such as a Cartesian coordinate system, of a layout.

Figure 11:
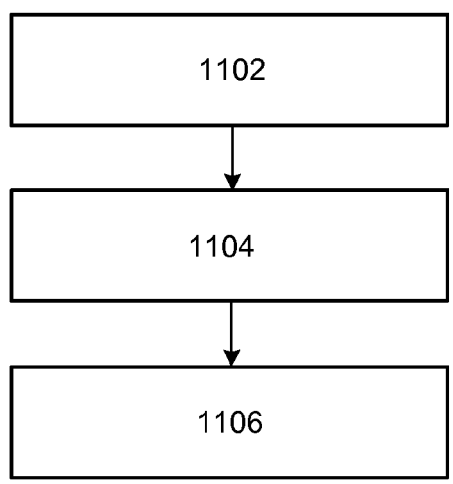
FIG. 11 is a flow chart of an exemplary process for removal of the singularity by adding the patch cell to the reticle system in accordance with an embodiment of the present invention.

Referring now to FIG. 11, therein is shown a flow chart of an exemplary process 1100 for removal of the singularity 802, of FIG. 8, by adding the patch cell 902, of FIG. 9, to the reticle system 110, of FIG. 1, in accordance with an embodiment of the present invention. The flow chart of the exemplary process 1100 depicts an identify singularity 1102.

The identify singularity 1102 may include detecting the coordinates of the vertices of the shapes in the reticle data 800. When the vertices of two shapes coincide the singularity 802 is detected. The detection of the singularity 802 leads to an insert a patch cell 1104.

The insert a patch cell 1104 may apply two of the lines 902, that are parallel, between the two shapes having the singularity 802, to form the patch cell 902 on the singularity 802. When the patch cell is properly applied a merge data 1106 may be invoked.

The merge data 1106 may perform a Boolean operation on all of the shapes in the reticle data 900 to form a series of the new shape 1002, of FIG. 10, for all of the shapes in the reticle data 1000. The new shapes 1002 will be free of the singularity 802 throughout the reticle data 1000.

It has been unexpectedly [found, determined, recognized, ascertained, identified, observed, detected, uncovered] that by applying the unit cell 200, of FIG. 2, and the patch cell 902, of FIG. 9, in conjunction with the grow and shrink strategy, all of the sub-geometries 302 and the singularities 802 may be removed from the reticle system 110.

Thus, it has been discovered that the integrated circuit system and device of the present invention furnishes important and heretofore unknown and unavailable solutions, capabilities, and functional aspects for producing integrated circuit systems having a better manufacturing yield and reduced cost.

Figure 12:
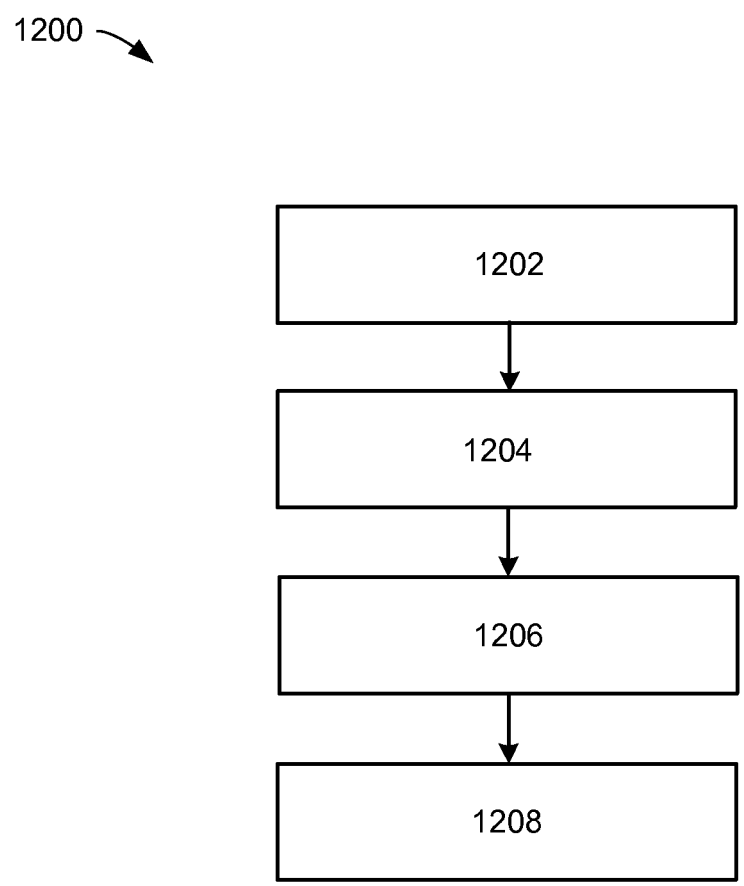
FIG. 12 is a flow chart of a method of manufacture of an integrated circuit system in an embodiment of the present invention.

Referring now to FIG. 12, therein is shown a flow chart of a method 1200 of manufacture of an integrated circuit system in an embodiment of the present invention. The method 1200 includes: forming reticle data in a block 1202; detecting a sub-geometry, a singularity, or a combination thereof in the reticle data in a block 1204; applying a unit cell, a patch cell, or a combination thereof for removing the sub-geometry, the singularity, or the combination thereof from the reticle data in a block 1206; and fabricating an integrated circuit from the reticle data in a block 1208.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit comprising:
   a first circuit layer, in a reticle pattern, having at least a first shape and a second shape connected by a unit cell, a patch cell, or a combination thereof from the reticle pattern for removing a sub-geometry, a singularity, or a combination thereof from the reticle pattern, the first shape and the second shape having vertices located to detect the sub-geometry, the singularity, or a combination thereof, the first circuit layer having a new shape formed by a Boolean operation on the first shape, the second shape, the unit cell, the patch cell, or a combination thereof includes new shapes formed on the integrated circuit, the patch cell includes lines, between rectangular shapes, spaced a measurement from the singularity on the reticle pattern includes a bridge region between the rectangular shapes; and
   at least a second circuit layer for forming a device.

2. The integrated circuit as claimed in claim 1 further comprising a width and a height of the unit cell based on the sub-geometry size.

3. The integrated circuit as claimed in claim 1 wherein the patch cell includes lines, between rectangular shapes, spaced a measurement from the singularity on the reticle pattern.

4. The integrated circuit as claimed in claim 1 further comprising a substrate having the reticle pattern formed thereon.

5. The integrated circuit as claimed in claim 1 wherein the singularity includes two rectangular shapes with a corner collocated.

6. The integrated circuit as claimed in claim 1 further comprising a width and a height of the unit cell based on the sub-geometry size includes a tab measurement with a fixed value.

7. The integrated circuit as claimed in claim 1 wherein the integrated circuit includes a substrate having the reticle pattern formed thereon includes the integrated circuit diced from the substrate.

8. The integrated circuit as claimed in claim 1 wherein the singularity includes two rectangular shapes with a corner collocated including determining a single point of contact of the rectangular shapes.

* * * * *